(12) United States Patent
Hong et al.

(10) Patent No.: US 8,293,554 B2
(45) Date of Patent: Oct. 23, 2012

(54) LUMINOUS DEVICE AND METHOD OF MANUFACTURING THE SAME

(75) Inventors: Ki-ha Hong, Seoul (KR); Sung-hoon Lee, Yongin-si (KR); Jong-seob Kim, Suwon-si (KR); Jai-kwang Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 12/585,489

(22) Filed: Sep. 16, 2009

(65) Prior Publication Data

US 2010/0081227 A1  Apr. 1, 2010

Related U.S. Application Data

(63) Continuation of application No. 12/005,365, filed on Dec. 27, 2007, now Pat. No. 7,608,852.

(30) Foreign Application Priority Data

Jul. 3, 2007  (KR) .................. 10-2007-0066766

(51) Int. Cl.
*H01L 33/00* (2010.01)

(52) U.S. Cl. .............. 438/47; 438/22; 438/719; 257/13; 257/E21.404

(58) Field of Classification Search .............. 438/22–47, 438/291, 938, 719, 752, 933, 753, 775; 257/13, 257/17, 29, E21.404, E21.408, 26; 977/759, 977/857

See application file for complete search history.

(56) References Cited

U.S. PATENT DOCUMENTS

| | | | |
|---|---|---|---|
| 5,976,957 A * | 11/1999 | Westwater et al. ........... | 438/478 |
| 6,855,606 B2 * | 2/2005 | Chen et al. .................... | 438/283 |
| 7,051,945 B2 | 5/2006 | Empedocles et al. | |
| 7,254,151 B2 * | 8/2007 | Lieber et al. ............... | 372/44.01 |
| 2002/0172820 A1 * | 11/2002 | Majumdar et al. ........... | 428/357 |
| 2003/0034529 A1 | 2/2003 | Fitzgerald et al. | |
| 2004/0061178 A1 * | 4/2004 | Lin et al. ....................... | 257/350 |
| 2004/0213307 A1 | 10/2004 | Lieber et al. | |
| 2005/0199731 A9 * | 9/2005 | Empedocles et al. ......... | 235/491 |
| 2005/0253138 A1 * | 11/2005 | Choi et al. ...................... | 257/40 |
| 2005/0275010 A1 * | 12/2005 | Chen et al. .................... | 257/315 |
| 2006/0052947 A1 | 3/2006 | Hu et al. | |
| 2006/0169788 A1 | 8/2006 | Empedocles et al. | |
| 2007/0155025 A1 * | 7/2007 | Zhang et al. ...................... | 438/3 |
| 2007/0221962 A1 * | 9/2007 | Ishizu .............................. | 257/255 |
| 2007/0222074 A1 * | 9/2007 | Bakkers et al. ............... | 257/750 |
| 2008/0014689 A1 | 1/2008 | Cleavelin et al. | |
| 2008/0135949 A1 * | 6/2008 | Lo et al. .......................... | 257/401 |
| 2008/0149914 A1 * | 6/2008 | Samuelson et al. ............... | 257/9 |
| 2008/0230802 A1 * | 9/2008 | Bakkers et al. ............... | 257/190 |

OTHER PUBLICATIONS

Aaron Prager, Strained Silicon, EE 666, Apr. 21, 2005, pp. 1-23 (www.nd.edu/~gsnider/EE666/666_05/APrager_StrainedSilicon.ppt).
Chinese Office Action dated Feb. 10, 2011 with English Translation.

* cited by examiner

*Primary Examiner* — Cuong Q Nguyen
*Assistant Examiner* — Yosef Gebreyesus
(74) *Attorney, Agent, or Firm* — Harness, Dickey & Pierce, P.L.C.

(57) ABSTRACT

A luminous device and a method of manufacturing the luminous device are provided. The luminous device includes a light emitting layer and first and second electrodes connected to the light emitting layer. The light emitting layer is a strained nanowire.

16 Claims, 15 Drawing Sheets

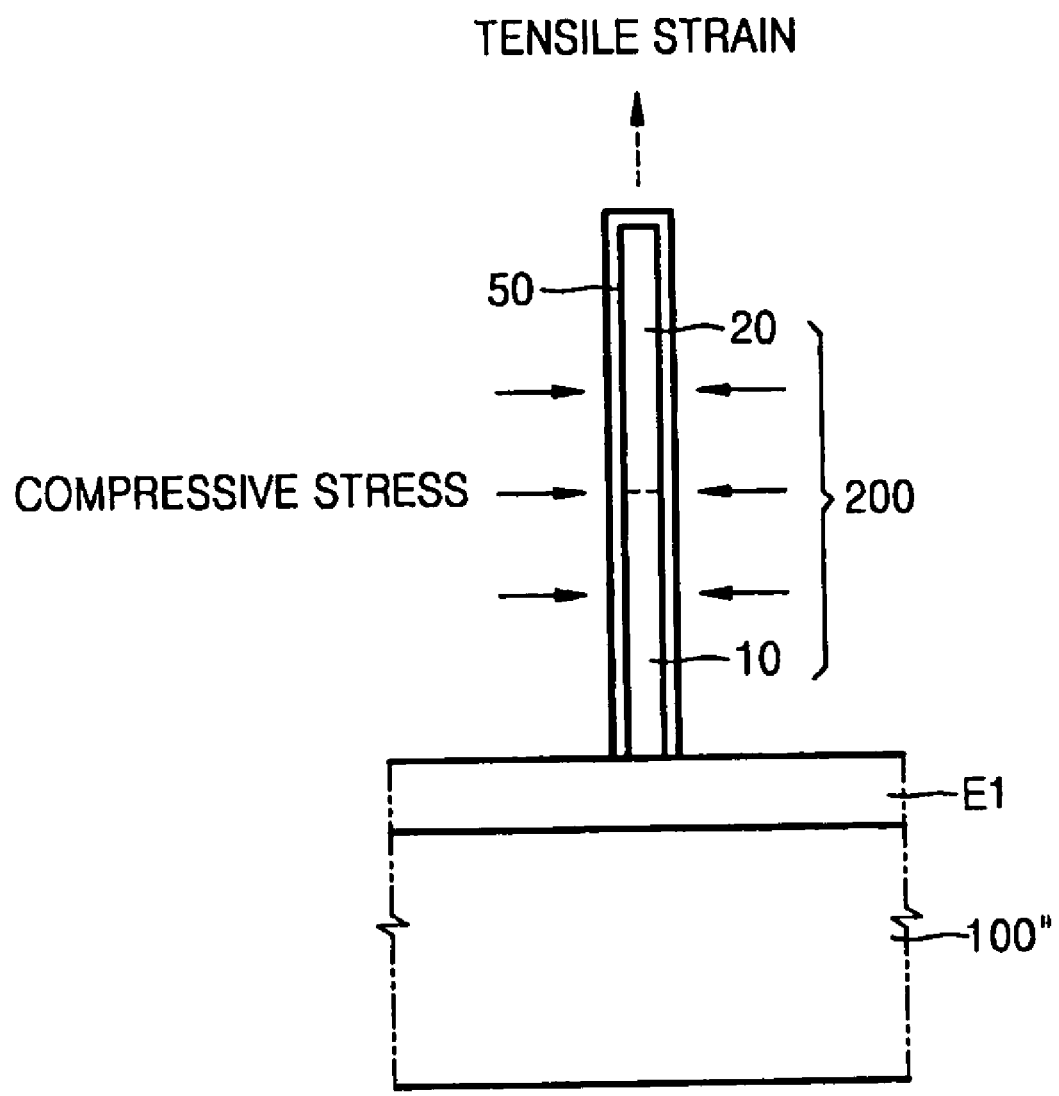

LUMINOUS DEVICE AND METHOD OF MANUFACTURING THE SAME

PRIORITY APPLICATION

This application is a continuation application of U.S. application Ser. No. 12/005,365, filed Dec. 27, 2007, now U.S. Pat. No. 7,608,852 which claims the benefit of priority under 35 U.S.C. §119 from Korean Patent Application No. 10-2007-0066766, filed on Jul. 3, 2007, in the Korean Intellectual Property Office, the entire disclosure of which is incorporated herein by reference.

BACKGROUND

1. Field

Example embodiments relate to a semiconductor device and a method of manufacturing the same. Other example embodiments relate to a luminous device that uses a nanowire as a light emitting layer and a method of manufacturing the same.

2. Description of the Related Art

Light emitted from luminous devices (e.g., light emitting diodes (LEDs) or laser diodes (LDs)) is generated by combining electrons and holes in a semiconductor layer of the luminous device. Wavelengths of light generated from the luminous devices vary according to the magnitude of energy band gap of the semiconductor layer (i.e., the light emitting layer).

The light emitting layer of a luminous device is generally formed of a group III-V or group II-VI semiconductor compound. The semiconductor compounds may be a direct transition type semiconductor having a direct band gap. In the direct transition type semiconductor, excited electrons emit energy mainly as photon energy.

The manufacture of luminous devices that use the conventional group III-V or group II-VI semiconductor compounds may be difficult because the process technique for semiconductor compounds is less developed than the process technique for silicon (Si). In particular, it may be difficult to realize an ohmic contact between the semiconductor compound and electrodes. It may be difficult to inject a conductive dopant into the semiconductor compound. For example, an ohmic contact with an electrode may be difficult with a layer of a GaN semiconductor compound. The injection of a p-type dopant with a ZnO layer may also difficult.

SUMMARY

Example embodiments relate to a semiconductor device and a method of manufacturing the same. Other example embodiments relate to a luminous device that uses a nanowire as a light emitting layer and a method of manufacturing the same.

Example embodiments provide a luminous device that may be manufactured using a technique for processing silicon. Example embodiments provide a luminous device that may have a higher light emitting efficiency.

According to example embodiments, there is provided a luminous device including a light emitting layer and first and second electrodes connected to the light emitting layer wherein the light emitting layer is a strained nanowire.

The nanowire may have a lattice constant that increases in a lengthwise direction thereof compared to a non-strained nanowire. The nanowire may be a silicon (Si) layer.

The luminous device may include a p-type semiconductor layer between the first electrode and the nanowire and an n-type semiconductor layer between the second electrode and the nanowire.

The p-type semiconductor layer and the n-type semiconductor layer may be separated from each other on a substrate. The nanowire may be formed between the p-type semiconductor layer and the n-type semiconductor layer. The nanowire may be parallel to the substrate.

The nanowire may include a p-type dopant region and an n-type dopant region. The entire region of the nanowire may be an undoped region. The nanowire may be separated from (or not contacting) the substrate.

The upper part of the substrate may have a lattice constant greater than that of the p-type semiconductor layer, the n-type semiconductor layer and/or the nanowire.

The p-type semiconductor layer, the n-type semiconductor layer and the nanowire may be silicon (Si) layers. The upper part of the substrate may be formed of germanium (Ge) or silicon germanium (SiGe).

The luminous device may include an insulating layer that fills a space between the nanowire and the substrate. The luminous device may include a stress control layer between the insulating layer and the p-type semiconductor layer, the n-type semiconductor layer and/or the substrate.

The stress control layer may have a lattice constant greater than that of the p-type semiconductor layer, the n-type semiconductor layer and/or the nanowire.

The p-type semiconductor layer, the n-type semiconductor layer and/or the nanowire may be silicon (Si) layers. The stress control layer may be a silicon nitride layer.

The first electrode, the nanowire and/or the second electrode may be sequentially and vertically stacked. The nanowire may be divided into an upper part and a lower part wherein the lower part is a first conductive type dopant region and the upper part is a second conductive type dopant region.

The nanowire may be divided into a lower part, a middle part and an upper part, wherein the lower part is a first conductive type dopant region, the middle part is un-doped region and the upper part is a second conductive type dopant region.

The luminous device may include an insulating layer between the first and second electrodes and at least a portion of the nanowire may be buried in the insulating layer.

According to example embodiments, there is provided a method of manufacturing a luminous device including forming a strained semiconductor layer on a substrate, patterning the semiconductor layer into two regions separated (a second and a third region) from each other and a nanowire fabrication region (a first region) that connects the two regions, separating the substrate from the nanowire forming region, forming a nanowire by isotropically etching the nanowire fabrication region, doping a first conductive type dopant in the second region, doping a second conductive type dopant in the third region and forming first and second electrodes that respectively contact the second and third regions.

The nanowire may be separated from the substrate by isotropically etching the upper part of the substrate which is exposed by patterning the semiconductor layer. The upper part of the substrate may have a lattice constant greater than that of the semiconductor layer.

The semiconductor layer may be a silicon (Si) layer. An upper part of the substrate may be germanium (Ge) or silicon germanium (SiGe) material.

The nanowire may be divided into a first part adjacent to the second region and a second part adjacent to the third region, wherein the first part is doped with a first conductive type dopant if the first conductive type dopant is doped in the second region.

If the second conductive type dopant may be doped in the third region and the second part may be doped with the second conductive type dopant.

After forming the nanowire, the method may include filling a space between the substrate and the nanowire with an insulating layer.

According to example embodiments, there is provided a method of manufacturing a luminous device including forming a semiconductor layer on a substrate, patterning the semiconductor layer into two regions (a second and a third region) separated from each other and a nanowire fabrication region that connects the two regions, separating the substrate from the nanowire fabrication region, forming a nanowire by isotropically etching the nanowire fabrication region. A first conductive type dopant may be doped in the second region. A second conductive type dopant may be doped in the third region. The method may include forming a stress control layer on sides of the second and third regions that face each other and the substrate between the second and third regions so that a tensile stress is applied to the nanowire in a lengthwise direction and forming first and second electrodes that respectively contact the second and third regions.

The nanowire may be separated from the substrate by isotropically etching the upper part of the substrate which is exposed by patterning the semiconductor layer.

The stress control layer may have a lattice constant greater than that of the semiconductor layer. The semiconductor layer may be a silicon (Si) layer. The stress control layer may be a silicon nitride layer.

The nanowire may be divided into a first part adjacent to the second region and a second part adjacent to the third region, wherein the first part is doped with a first conductive type dopant if the first conductive type dopant is doped in the second region.

The second conductive type dopant may be doped in the third region and the second part may be doped with the second conductive dopant.

After forming the stress control layer, the method may include forming an insulating layer on the stress control layer.

According to example embodiments, there is provided a method of manufacturing a luminous device including forming a vertical semiconductor nanowire on a first electrode, forming an oxide layer by oxidizing side surfaces of the nanowire so that a tensile stress is applied to the nanowire in a lengthwise direction thereof and forming a second electrode that contacts the nanowire.

The nanowire may be formed by performing a growing method using a catalyst. The nanowire may be divided into a lower part and an upper part, wherein the lower part is a first conductive type dopant region and the upper part is a second conductive type dopant region.

The nanowire may be divided into a lower part, a middle part and an upper part wherein the lower part is a first conductive type dopant region, the middle part is un-doped region and the upper part is a second conductive type dopant region.

If the oxide layer is formed on the upper surface of the nanowire, the method may include forming an insulating layer covering the oxide layer on the first electrode and etching the insulating layer until the nanowire is exposed after forming the oxide layer and prior to forming the second electrode.

If the oxide layer is formed on the upper surface of the nanowire, the method may include removing the oxide layer, forming an insulating layer covering the nanowire on the first electrode and etching the insulating layer until the nanowire is exposed after forming the oxide layer and prior to forming the second electrode.

BRIEF DESCRIPTION OF THE DRAWINGS

Example embodiments will be more clearly understood from the following detailed description taken in conjunction with the accompanying drawings. FIGS. 1A-10D represent non-limiting, example embodiments as described herein.

FIG. 1A is a diagram illustrating a cross-sectional view of a luminous device according to example embodiments;

FIG. 2 is a diagram illustrating a cross-sectional view of a luminous device according to example embodiments, FIGS. 3 and 4 are diagrams illustrating cross-sectional views of luminous devices according to example embodiments;

FIGS. 5 through 7 are graphs showing the variation of band gaps of nanowires according to the degree of strain and directions of strain of the nanowires;

FIGS. 10A through 10D are diagrams illustrating cross-sectional views of a method of manufacturing a luminous device according to example embodiments.

DETAILED DESCRIPTION OF EXAMPLE EMBODIMENTS

Figure 1A:
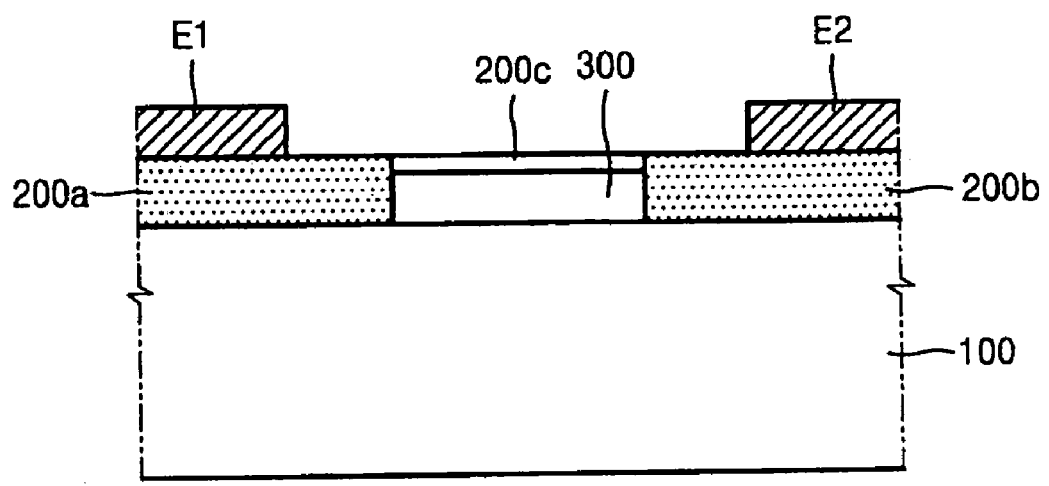

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a semiconductor device and a method of manufacturing the same. Other example embodiments relate to a luminous device that uses a nanowire as a light emitting layer and a method of manufacturing the same.

Figure 1B:
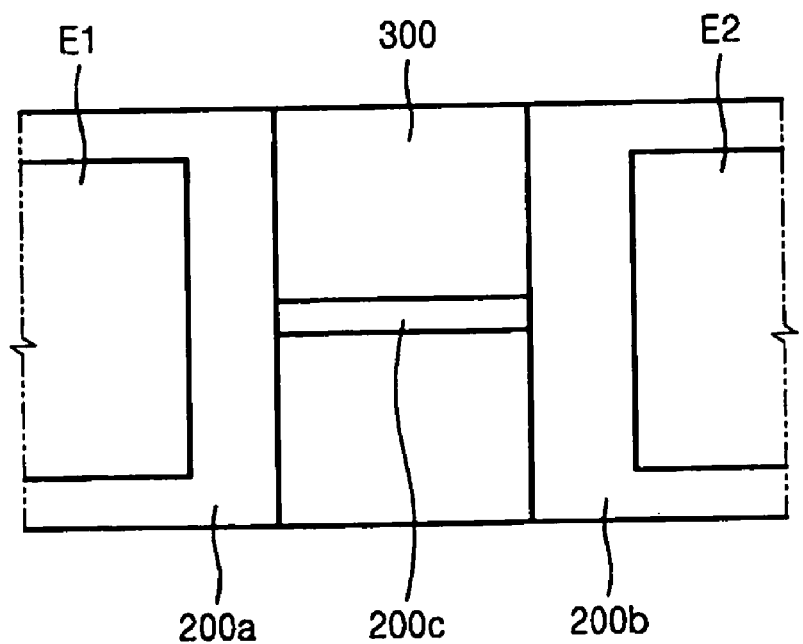
FIG. 1B is a diagram illustrating a plan view of a luminous device according to example embodiments.

FIGS. 1A and 1B are diagrams illustrating a cross-sectional view and a plan view, respectively, of a luminous device according to example embodiments.

Referring to FIGS. 1A and 1B, a p-type semiconductor layer 200a and an n-type semiconductor layer 200b separated from (or not contacting) each other may be formed on a substrate 100. The p-type semiconductor layer 200a and the n-type semiconductor layer 200b may be silicon (Si) layers. The p-type semiconductor layer 200a and the n-type semiconductor layer 200b may be connected to a nanowire 200c, which is a light emitting layer. The nanowire 200c may be a layer formed of a semiconductor material (e.g., silicon (Si)). The nanowire 200c may be parallel to the substrate 100. The nanowire 200c may be separated a desired distance from an upper surface of the substrate 100. The nanowire 200c may be strained by receiving tensile stress in a lengthwise direction.

The nanowire 200c may not include a conductive dopant. A portion of the nanowire 200c may be a p-type dopant region and the rest of the nanowire 200c may be an n-type dopant region. For example, a portion of the nanowire 200c adjacent to the p-type semiconductor layer 200a may be the p-type dopant region and the rest of the nanowire 200c may be the n-type dopant region.

An upper part of the substrate 100 may be formed of a material (e.g., silicon germanium (SiGe) or germanium (Ge)) having a lattice constant greater than that of silicon (Si). The substrate 100 may be a single or multiple layer structure. For example, the substrate 100 may be a multiple layer in which a silicon (Si) layer and a silicon germanium (SiGe) layer are sequentially stacked. The tensile strain of the nanowire 200c may be caused by the difference in lattice constant of the upper part of the substrate 100 from the lattice constants of the nanowire 200c, the p-type semiconductor layer 200a and/or the n-type semiconductor layer 200b.

A first electrode E1 and a second electrode E2 that contact the p-type semiconductor layer 200a and the n-type semiconductor layer 200b, respectively, may be formed on the p-type semiconductor layer 200a and the n-type semiconductor layer 200b.

A transparent insulating layer 300 may be formed on the substrate 100 between the p-type semiconductor layer 200a and the n-type semiconductor layer 200b. The transparent insulating layer 300 may be a silicon oxide layer or a resin layer. The transparent insulating layer 300 may be formed at the same height as the p-type semiconductor layer 200a. The material for forming the transparent insulating layer 300 and the height thereof may be changed. The nanowire 200c may be disposed (or formed) on the transparent insulating layer 300.

Although not shown, a groove having a desired depth may be formed on the upper part of the substrate 100 between the p-type semiconductor layer 200a and the n-type semiconductor layer 200b. The groove may be extended to some degree under the p-type semiconductor layer 200a and the n-type semiconductor layer 200b. If the groove is formed, the transparent insulating layer 300 may be formed on the groove.

Figure 2:
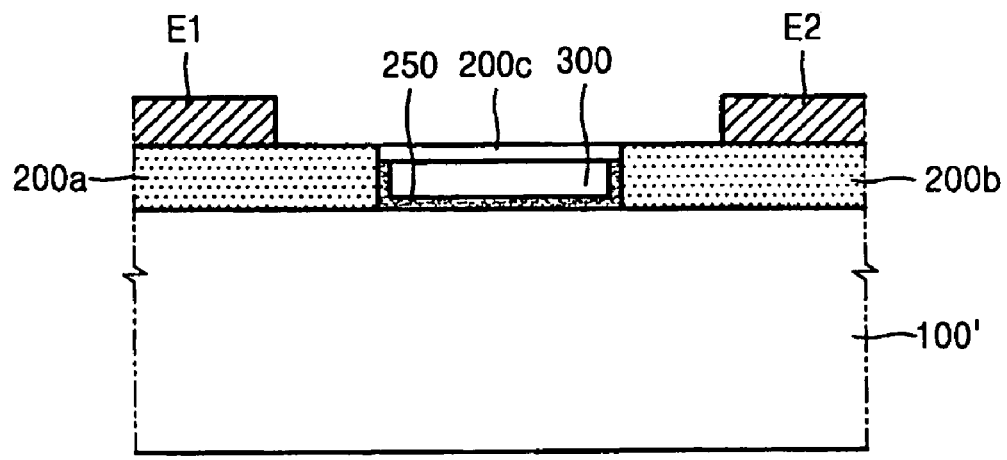

The luminous device depicted in FIG. 1A may be modified in various forms, for example, as shown in FIG. 2. In FIGS. 1A and 2, like reference numeral indicates identical elements and therefore descriptions thereof will be omitted for the sake of brevity.

Referring to FIG. 2, a stress control layer 250 may be formed between (or contacting) a transparent insulating layer 300 and a p-type semiconductor layer 200a, an n-type semiconductor layer 200b and a substrate 100'. The stress control layer 250 may have a lattice constant greater than that of the p-type semiconductor layer 200a, the n-type semiconductor layer 200b and/or the nanowire 200c. The p-type semiconductor layer 200a, the n-type semiconductor layer 200b and/or the nanowire 200c may be a silicon (Si) layer. The stress control layer 250 may be a silicon nitride layer. The tensile strain of the nanowire 200c may be caused by the difference of lattice constant of the stress control layer 250 from the lattice constants of the nanowire 200c, the p-type semiconductor layer 200a and the n-type semiconductor layer 200b. The substrate 100' may be a silicon (Si) substrate. The substrate 100' may be identical substrate to the substrate 100 of FIG. 1A.

In FIGS. 1A, 1B, and 2, a plurality of nanowires 200c may be included between the p-type semiconductor layer 200a and the n-type semiconductor layer 200b. A reflection layer (not shown) may be included on a desired region between substrates 100 and 100' and the nanowire 200c.

Figure 3:
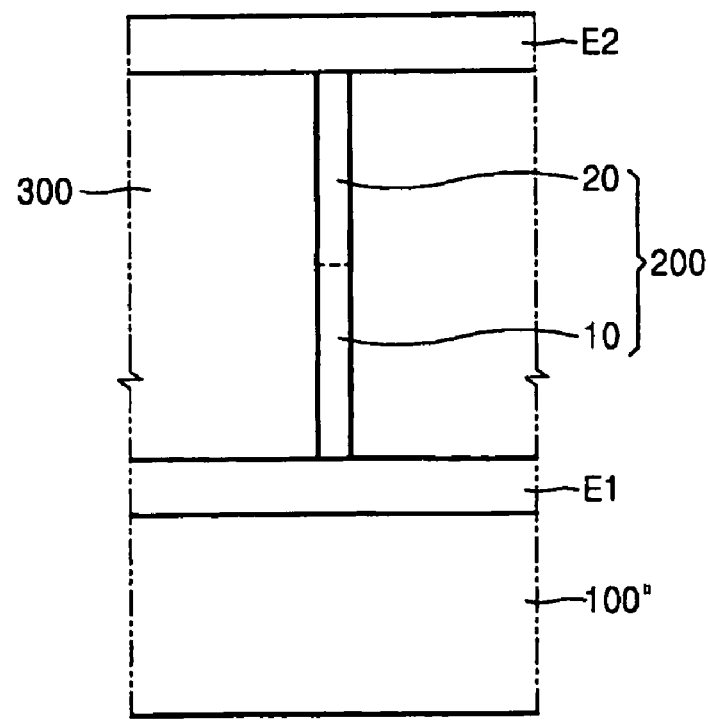
Figure 4:
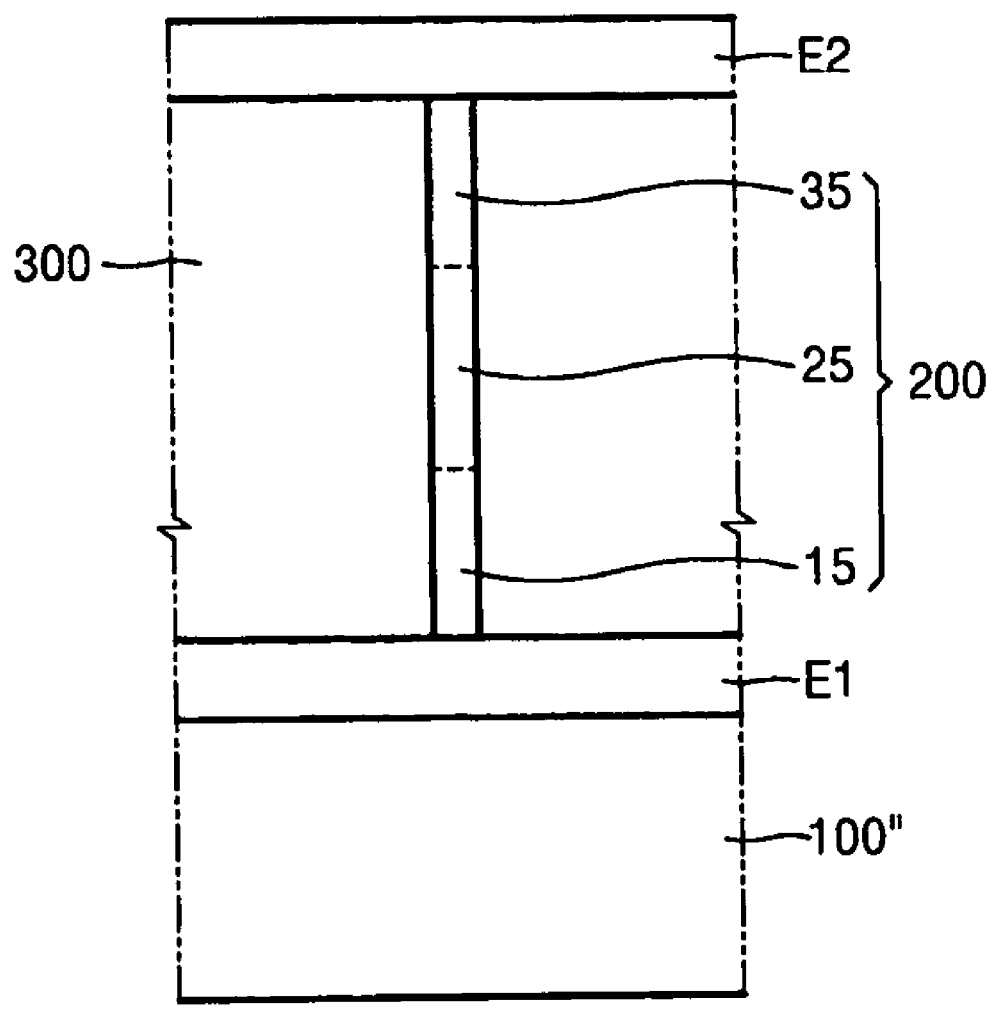

FIGS. 3 and 4 are diagrams illustrating cross-sectional views of luminous devices according to example embodiments.

Referring to FIGS. 3 and 4, a first electrode E1 may be formed on a substrate 100". A nanowire 200 may be formed on the first electrode E1. The nanowire 200 may be formed perpendicular to the substrate 100". The nanowire 200 may be tensile strained in a lengthwise direction thereof. The nanowire 200 may be a silicon (Si) layer. A transparent insulating layer 300 may be formed on the first electrode E1 around the nanowire 200. The transparent insulating layer 300 may have the same height as the nanowire 200. All (or a portion) of the nanowire 200 may be buried in the transparent insulating layer 300. A second electrode E2 that contacts the nanowire 200 may be formed on the transparent insulating layer 300. The formation of the transparent insulating layer 300 is optional.

Referring to FIG. 3, the nanowire 200 may be divided into a lower part 10 and an upper part 20. The lower part 10 may be a first conductive type dopant region and the upper part 20 may be a second conductive type dopant region. For example, the lower part 10 may be a p-type dopant region and the upper part 20 may be an n-type dopant region.

Referring to FIG. 4, the nanowire 200 may be divided into a lower part 15, a middle part 25 and an upper part 35. The lower part 15 may be a first conductive type dopant region, the middle part 25 may be an un-doped region and the upper part 35 may be a second conductive type dopant region. For example, the lower part 15 may be a p-type dopant region and the upper part 35 may be an n-type dopant region.

Although not shown in FIGS. 3 and 4, a thin oxide layer may surround side surfaces of the nanowire 200. A plurality of nanowires 200 may be formed between the first and second electrodes E1 and E2.

As described above, the luminous devices according to example embodiments may include a nanowire 200 or 200c as a light emitting layer.

If the size of a desired material layer is reduced to a nano level, quantum effects may occur. The light emitting layer may have different properties if the light emitting layer is in a bulk structure and if the light emitting layer is in a nano structure. For example, a Si bulk body may have an indirect band gap and a silicon (Si) nanowire may have a direct band gap.

An indirect transition type semiconductor having an indirect band gap is a material in which the momentum at the highest point of a valence band is different from that of at the lowest point of a conductive band. In the indirect transition type semiconductor, excited electrons emit their energy in the form of heat and vibration energy (e.g., phonon energy). It may be difficult to realize a luminous device using a silicon (Si) bulk body having an indirect band gap.

A direct transition type semiconductor having a direct band gap may be a material in which the momentum at the highest point of a valence band is identical to the momentum at the lowest point of a conductive band. In the direct transition type semiconductor, excited electrons emit their energy mainly in the form of photon energy.

Because a Si nanowire may have a direct band gap, the manufacture of a luminous device using the silicon (Si) nanowire is possible. Because the band gap varies according to the diameter of the nanowires 200 and 200c, the wavelengths of light generated by the luminous device may be readily controlled by changing the diameter of the nanowires 200 and 200c. The diameter of the nanowires 200 or 200c may be controlled to a few tens of nanometers (nm). The diameter of the nanowires 200 or 200c may be 20 nm or less.

The nanowires 200 or 200c, used as the light emitting layers, may be strained nanowires to which a tensile stress is applied, increasing the light emission efficiency.

Figure 5:
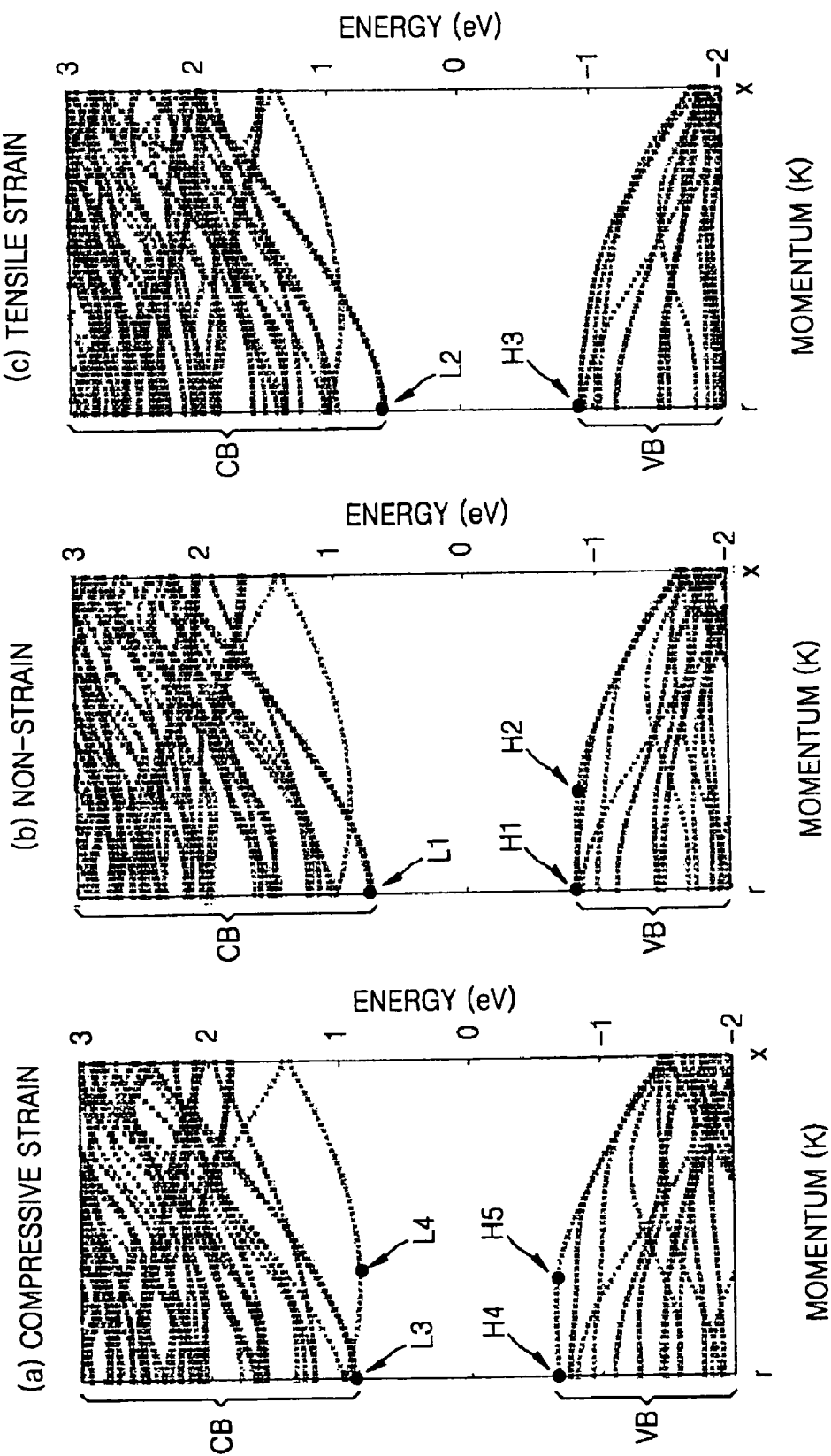
Figure 6:
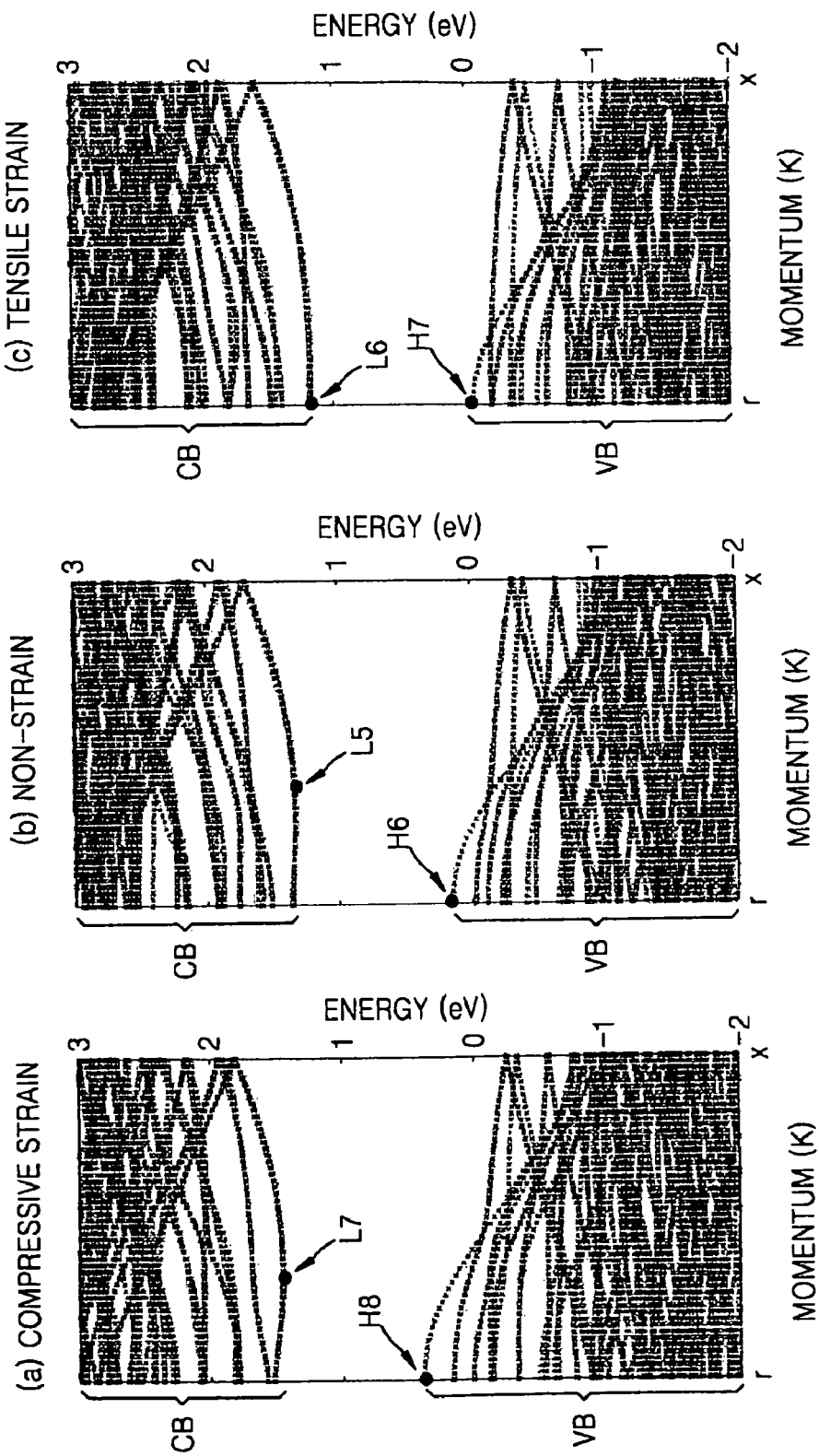
Figure 7:
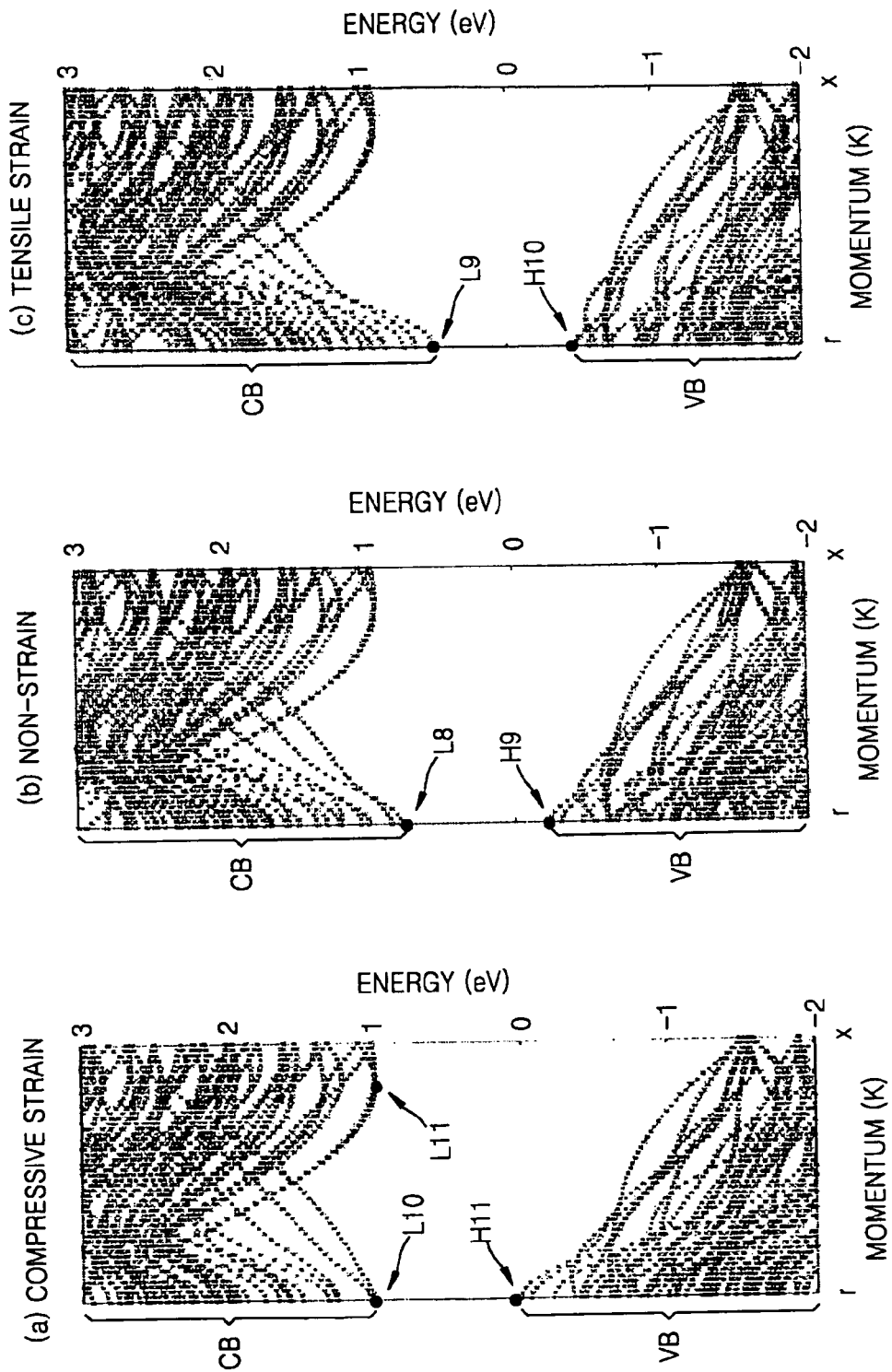

FIGS. 5 through 7 are graphs showing the variation of band gap of nanowires according to the degree of strain and direction of strain of the nanowires. FIG. 5 shows the variation of band gap with respect to a first silicon (Si) nanowire, which has a (100) surface perpendicular to a lengthwise direction thereof. FIG. 6 shows the variation of band gap with respect to a second silicon (Si) nanowire, which has a (111) surface perpendicular to a lengthwise direction thereof. FIG. 7 shows the variation of band gap with respect to a third silicon (Si) nanowire, which has a (110) surface perpendicular to a lengthwise direction thereof.

The effective diameter of the first, second and third silicon (Si) nanowires may be approximately 2.2 nm.

In FIGS. 5 through 7, graphs marked "(a)" indicate the results of samples wherein lattice constants are deformed 2% by placing a compressive stress in the lengthwise direction of the Si nanowires. Graphs marked "(b)" indicate the results of samples that have not been deformed. Graphs marked "(c)" indicate the results of samples wherein lattice constants are deformed 2% by placing tensile stress in the lengthwise direction of the Si nanowires.

In FIGS. 5 through 7, the horizontal axis is momentum (K) and the vertical axis is energy (eV). VB indicates a valence band and CB indicates a conduction band. A band gap is the difference between the valence band VB and the conduction band CB.

Referring to graph (b) of FIG. 5, first point H1 and second point H2 are located on high positions in the valence band VB. Points between the first point H1 and the second point H2 have nearly the same energy. The lowest point L1 in the conduction band CB does not have an identical momentum to that of the highest point in the valence band VB. As such, the nanowire corresponding to the graph (b) of FIG. 5 (i.e., the Si nanowire not strained) has indirect transition type semiconductor characteristics.

Referring to graph (c) of FIG. 5, the lowest point L2 in the conduction band CB has an identical momentum to that of the highest point H3 in the valence band VB. As such, the nanowire corresponding to the graph (c) of FIG. 5 (i.e., the Si nanowire strained by receiving a tensile stress) has direct transition type semiconductor characteristics.

Referring to graph (a) of FIG. 5, third point H4 and fourth point H5 are located on high positions in the valence band VB. Points between the third point H4 and fourth point H5 have nearly the same energy level. Fifth point L3 and sixth point L4 in the conduction band CB are located in low positions and have similar energy to each other. As such, the nanowire that corresponds to the graph (a) of FIG. 5 (i.e., a nanowire strained by receiving a compressive stress) has indirect transition type semiconductor characteristics.

As described above, the nanowire that has been strained by receiving tensile stress has direct transition type semiconductor characteristics. The nanowire that has been strained by receiving compressive stress has indirect transition type semiconductor characteristics.

In the luminous devices that use the nanowires 200 or 200c strained by tensile stress of FIGS. 1A through 4, the generation of phonons may decrease and the generation of photons may increase, which indicates that the luminous device according to example embodiments has higher light emission efficiency.

In FIGS. 6 and 7, similar trends are observed as in FIG. 5.

Referring to graph (b) of FIG. 6, the lowest point L5 in the conduction band CB has a momentum different from that of the highest point H6 in the valence band VB. As such, the second Si nanowire that has no strain has indirect transition type semiconductor characteristics.

Referring to graph (c) of FIG. 6, in the second Si nanowire which is strained by tensile stress, the lowest point L6 in the conduction band CB has the same momentum as that of the highest point H7 in the valence band VB. The second Si nanowire that has been strained by tensile stress has direct transition type semiconductor characteristics.

Referring to graph (a) of FIG. 6, in the case of the second Si nanowire which is strained by compressive stress, the lowest point L7 in the conduction band CB has a different momentum from that of the highest point H8 in the valence band VB. As such, the second Si nanowire that has been strained by compressive stress has indirect transition type semiconductor characteristics.

Referring to graph (b) of FIG. 7, the lowest point L8 in the conduction band CB has the same momentum as the highest point H9 in the valence band VB. As such, the third Si nanowire that has no strain has direct transition type semiconductor characteristics.

Referring to graph (c) of FIG. 7, in the third Si nanowire which is strained by tensile stress, the lowest point L9 in the conduction band CB has the same momentum as that of the highest point H10 in the valence band VB. The third Si nanowire that has been strained by tensile stress has direct transition type semiconductor characteristics.

Referring to graph (a) of FIG. 7, in the case of the third Si nanowire which is strained by compressive stress, tenth point L10 and eleventh point L11 are located on low positions in the conduction band CB. The highest point H11 in the valence band VB has a different momentum than lowest point of conduction band. As such, the nanowire that corresponds to the graph (a) of FIG. 7 (i.e., a nanowire strained by receiving a compressive stress) may have indirect transition type semiconductor characteristics.

FIGS. 8A through 8F are diagrams illustrating perspective views of a method of manufacturing a luminous device according to example embodiments.

Figure 8A:
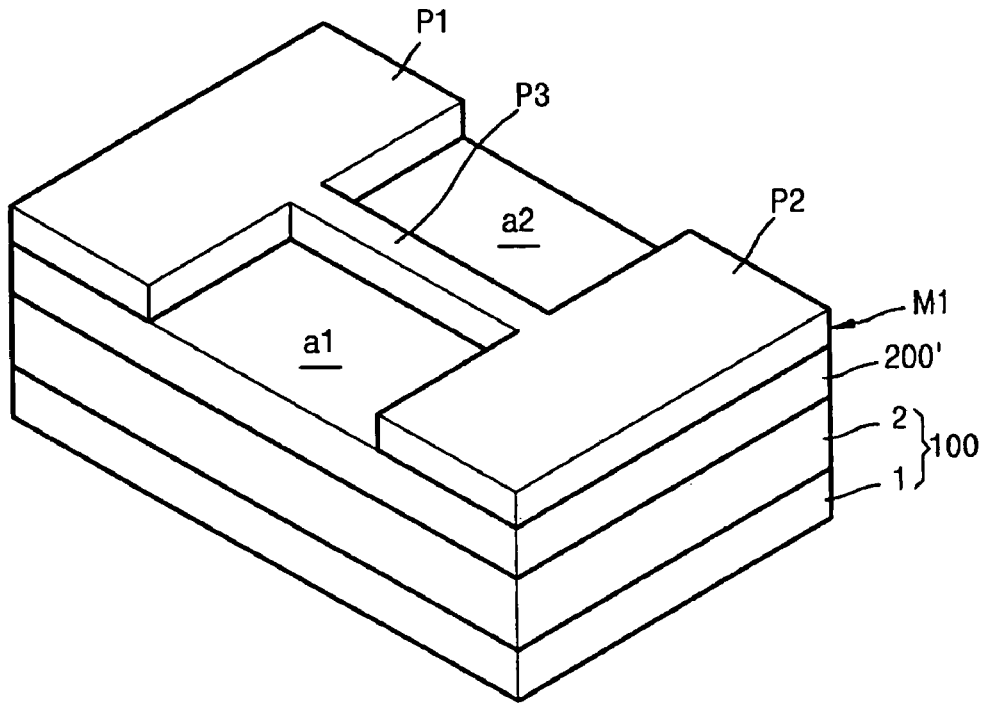
FIGS. 8A through 8F are diagrams illustrating perspective views of a method of manufacturing a luminous device according to example embodiments.

Referring to FIG. 8A, a strained semiconductor layer (e.g., a strained Si layer 200') may be formed on a substrate 100. The substrate 100 may have a structure in which a first Si layer 1 and a SiGe layer 2 may be sequentially stacked. The substrate 100 may have a structure in which the first Si layer 1 and the SiGe layer 2 have different structures. For example, the SiGe layer 2 may be replaced by a Ge layer. The substrate 100 may be a Ge layer. Because SiGe has a lattice constant higher than that of Si, the strained Si layer 200' may be formed on the SiGe layer 2.

An H-type mask layer M1 may be formed on the strained Si layer 200'. The mask layer M1 includes first part P1, second part P2 and a third part P3 that connects the first part P1 and the second part P2. The third part P3 establishes a region for forming a nanowire. At least two regions a1 and a2 of the strained Si layer 200' may not be covered by the mask layer M1.

The exposed regions a1 and a2 of the strained Si layer 200' may be etched until the substrate 100 is exposed. As such, as depicted in FIG. 8B, the strained Si layer 200' may have the same shape as the mask layer M1.

Figure 8B:
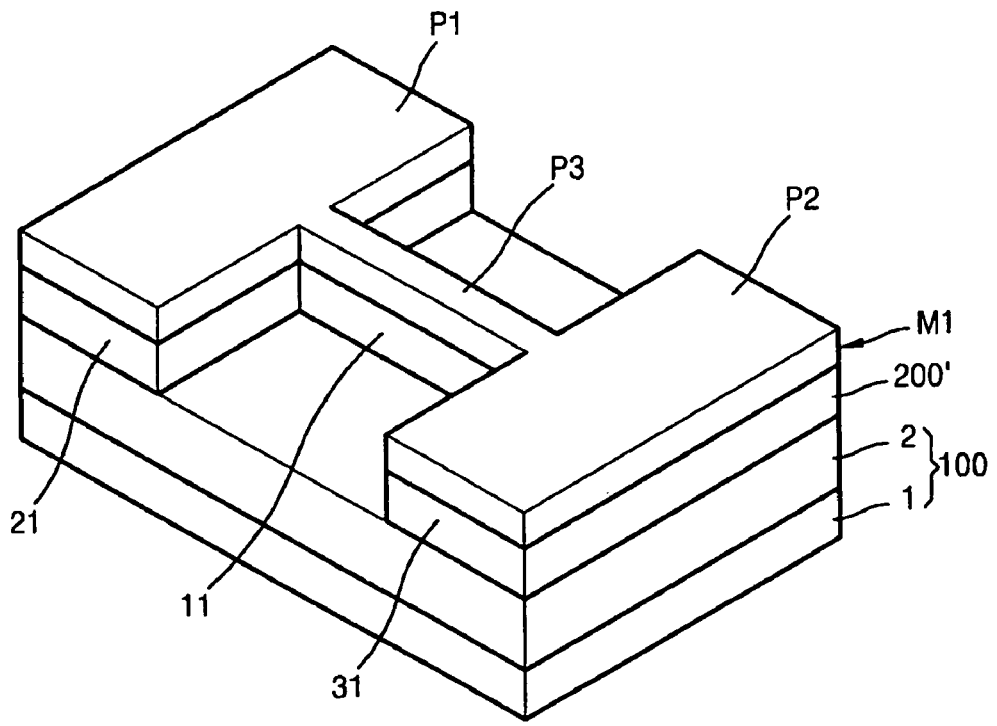

Referring to FIG. 8B, a first region 11 corresponds to the third part P3 of the mask layer M1. Second region 21 and third region 31 correspond to the first part P1 and the second part P2, respectively, of the mask layer M1.

After removing the mask layer M1, the exposed portion of the substrate 100 (i.e., the exposed SiGe layer 2) may be isotropically etched. The resultant product is depicted in FIG. 8C.

Figure 8C:
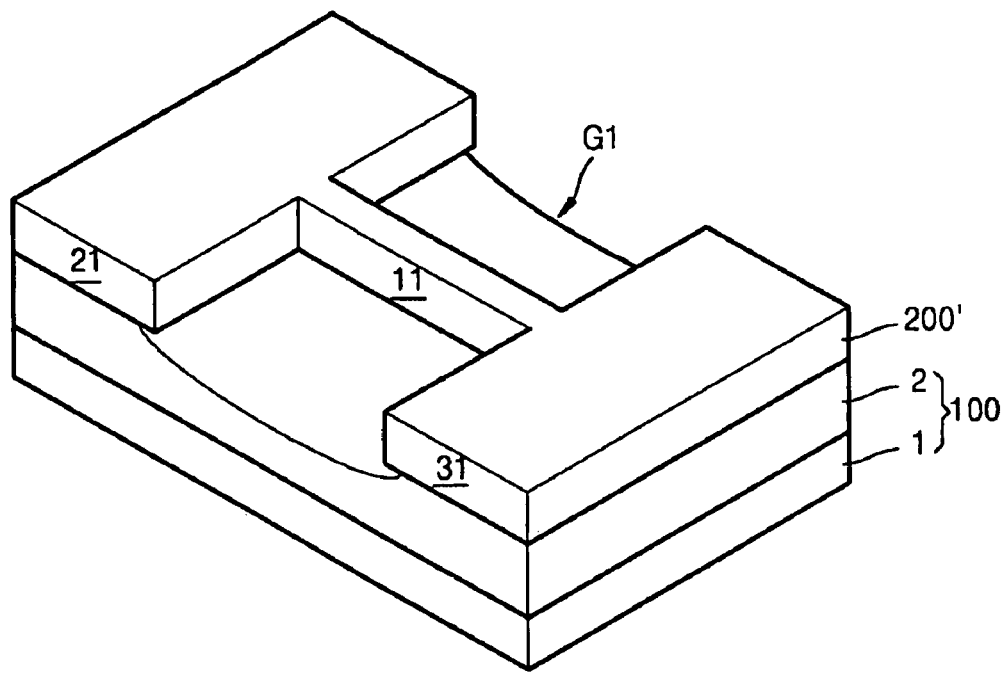

Referring to FIG. 8C, a groove G1 may be formed in the SiGe layer 2 between the second region 21 and third region 31 by isotropically etching. A space may be formed under the first region 11 due to the groove G1. A lower surface of the first region 11 may be exposed. The groove G1 may extend to some degree under the second region 21 and third region 31, forming under-cuts.

Figure 8D:
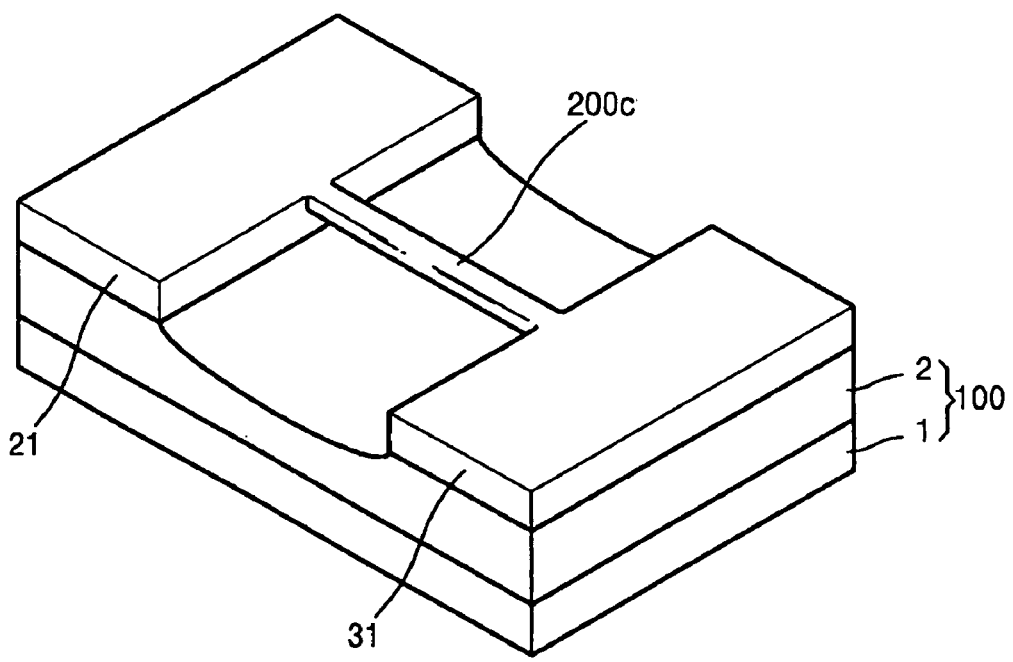
Figure 8E:
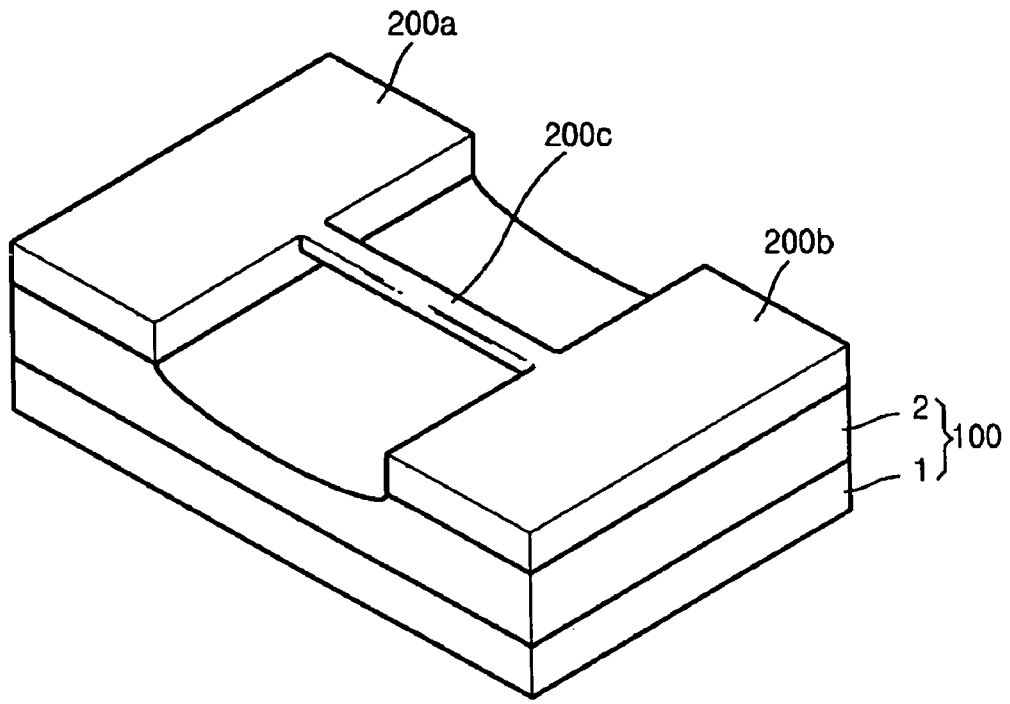

The first region 11 may be isotropically etched. As such, the thickness and width of the first region 11 may be reduced. As such, the first region 11 becomes a nanowire 200c as depicted in FIG. 8D. If the first region 11 is isotropically etched, portions of the second region 21 and the third region 31 may be etched. As such, the under-cuts under the second and third regions 21 and 31 disappear.

A p-type dopant may be doped in the second region 21. An n-type dopant may be doped in the third region 31. As such, the second region 21 and the third region 31 may be p-type and n-type semiconductor layers 200a and 200b, respectively. If the p-type dopant is doped in the second region 21, a portion of the nanowire 200c adjacent to the second region 21 may be doped with the p-type dopant. A portion of the nanowire 200c adjacent to the third region 31 may be doped with the n-type dopant.

Figure 8F:
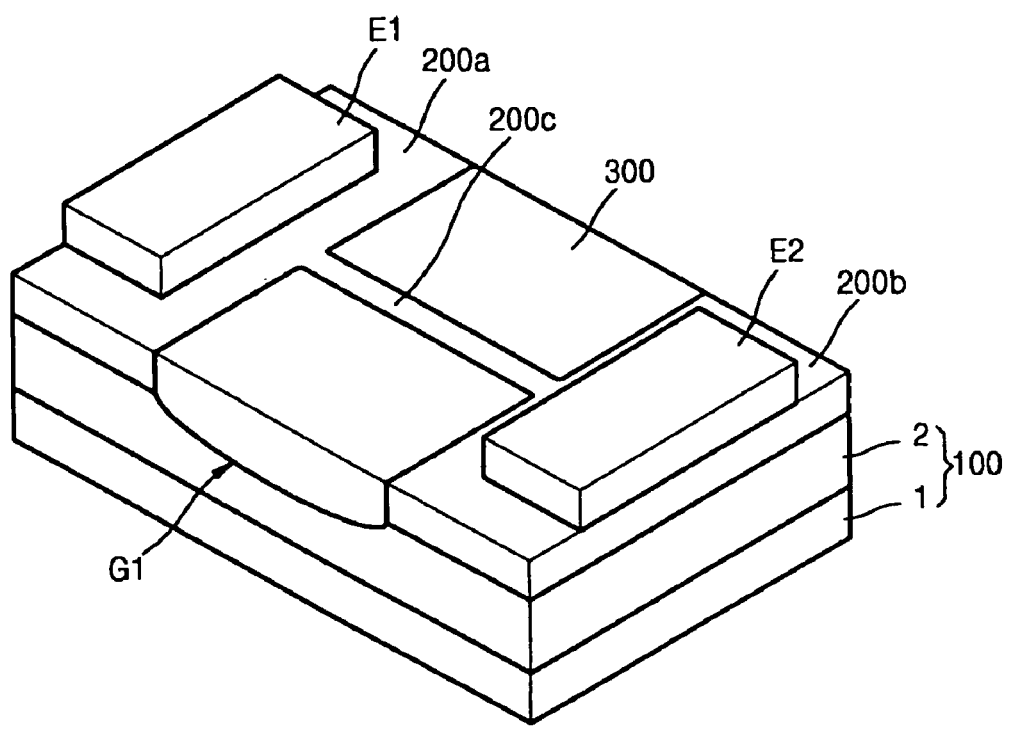

Referring to FIG. 8F, a transparent insulating layer 300 may be formed on the substrate 100 between the p-type semiconductor layer 200a and the n-type semiconductor layer 200b. The transparent insulating layer 300 may be formed on the groove G1. The transparent insulating layer 300 may be formed with the thickness as the same height as the nanowire 200c to fill the space below the nanowire 200c. The transparent insulating layer 300 may be formed of a silicon oxide or resin.

First and second electrodes E1 and E2 may be formed on the p-type semiconductor layer 200a and the n-type semiconductor layer 200b, respectively. Although not shown, a second transparent insulating layer may be formed to approximately the height of the first and second electrodes E1 and E2. The second transparent insulating layer may be formed on the exposed portions of the transparent insulating layer 300, the nanowire 200c, the p-type semiconductor layer 200a and the n-type semiconductor layer 200b.

FIGS. 9A through 9F are diagrams illustrating perspective views of a method of manufacturing a luminous device according to example embodiments.

Figure 9A:
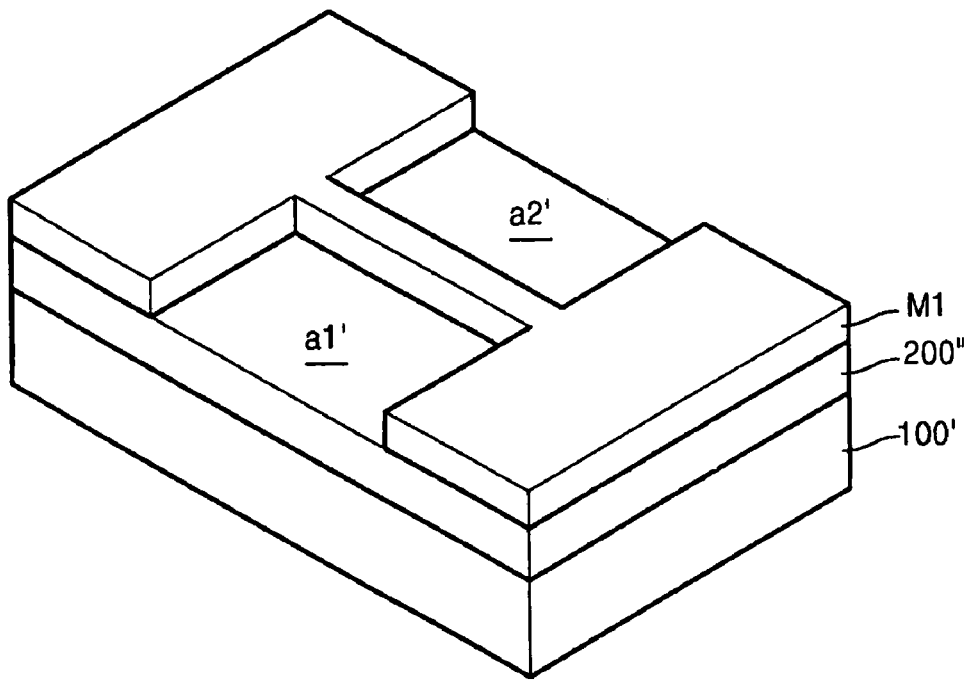
FIGS. 9A through 9F are diagrams illustrating perspective views of a method of manufacturing a luminous device according to example embodiments.

Referring to FIG. 9A, a semiconductor layer 200" (e.g., a Si layer) may be formed on a substrate 100'. The substrate 100' and the semiconductor layer 200" may be portions of a silicon-on-insulator (S01) substrate. The semiconductor layer 200" may be an unstrained Si layer.

A mask layer M1 may be formed on the semiconductor layer 200". The mask layer M1 is equivalent to the mask layer M1 of FIG. 8A. Two exposed portions a1' and a2' of the semiconductor layer 200" may be etched until the substrate 100' is exposed. As such, the semiconductor layer 200" may the same (or similar) shape as the mask layer M1 as shown in FIG. 9B.

Figure 9B:
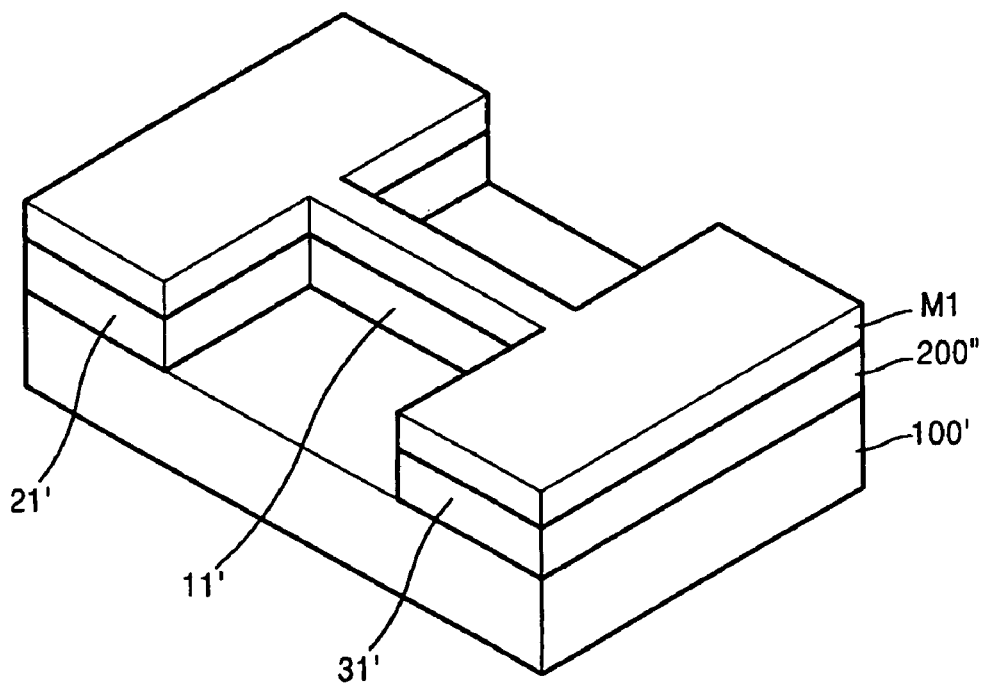

First region 11', second region 21' and third region 31' in FIG. 9B are equivalent to the first region 11, the second region 21 and the third region 31 in FIG. 8B.

After removing the mask layer M1, the exposed substrate 100' may be isotropically etched.

Figure 9C:
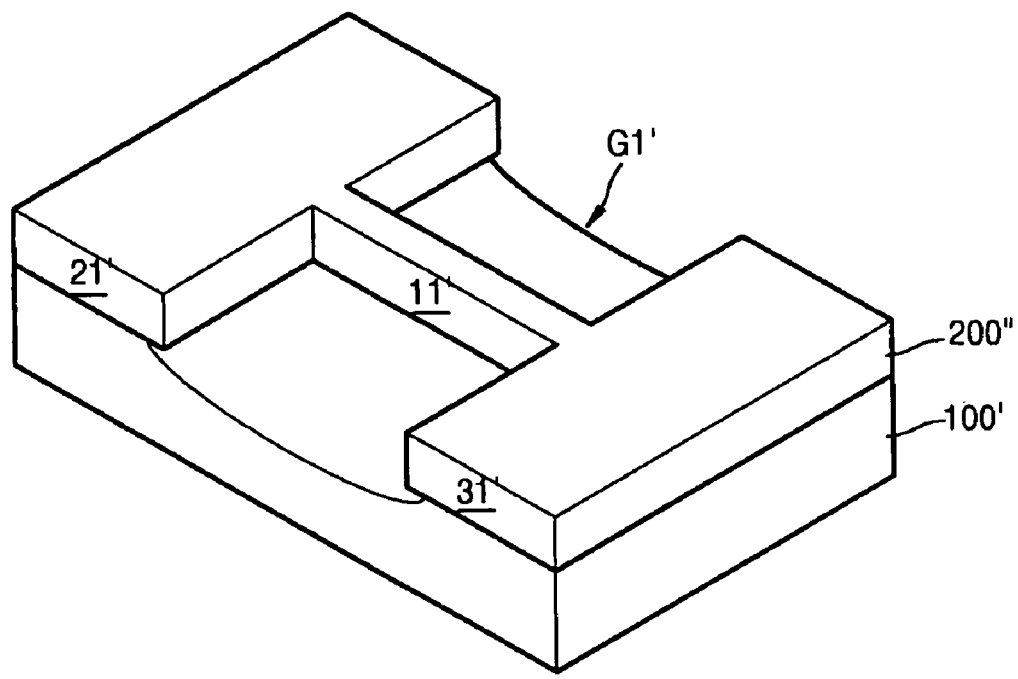

Referring to FIG. 9C, a groove G1' may be formed in the substrate 100' between the second and third regions 21' and 31'. A space may be formed under the first region 11' due to the groove G1'. A bottom surface of the first region 11' may be exposed. The groove G1' may extend to some degree under the second region 21' and third region 31', forming under-cuts.

Figure 9D:
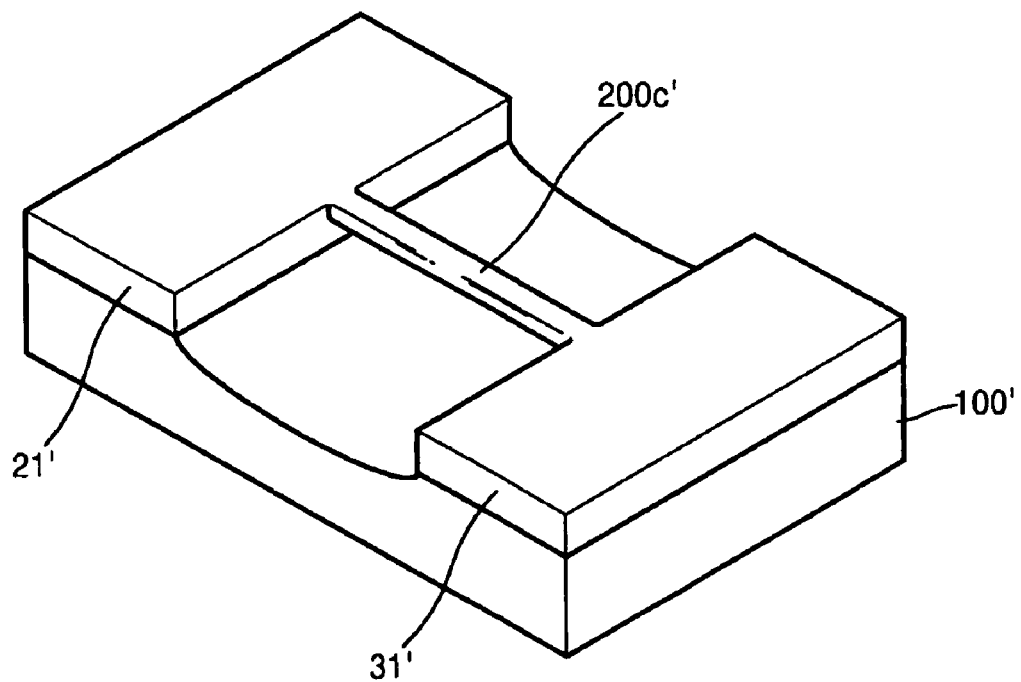

The first region 11' may be isotropically etched. The thickness and width of the first region 11' may be reduced. As depicted in FIG. 9D, the first region 11' becomes a nanowire 200c'. If the first region 11' is isotropically etched, portions of the second region 21' and third region 31' may be etched. The under-cuts under the second regions 21' and third region 31' disappear.

A p-type dopant may be doped in the second region 21'. An n-type dopant may be doped in the third region 31'. As such, the second region 21' and the third region 31' may be a p-type semiconductor layer 200a' and an n-type semiconductor layer 200b'. If the p-type dopant is doped in the second region 21', a portion of the nanowire 200c' adjacent to the second region 21' may be doped with the p-type dopant. A portion of the nanowire 200c' adjacent to the third region 31' may be doped with the n-type dopant.

Figure 9E:
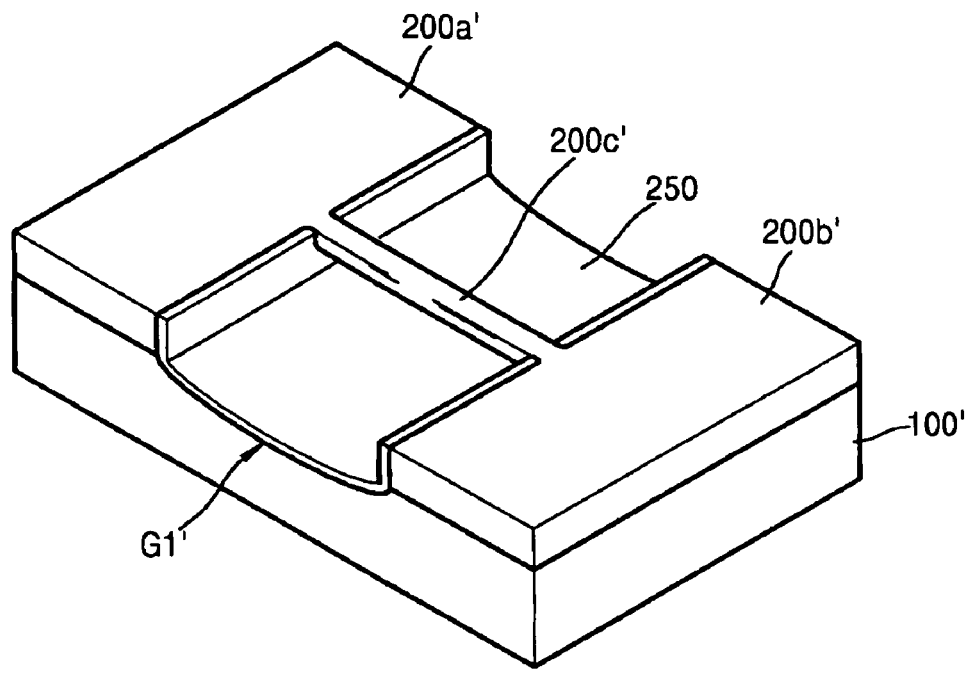

Referring to FIG. 9E, a stress control layer 250 may formed on sides of the p-type semiconductor layer 200a' and the n-type semiconductor layer 200b' facing each other and on the surface of the groove G1'. A stress control material layer that covers the inner walls of the p-type semiconductor layer 200a' and the n-type semiconductor layer 200b' facing each other. The surface of the groove G1' may be formed on the p-type semiconductor layer 200a', the n-type semiconductor layer 200b' and the nanowire 200c'. The stress control material layer formed on the p-type semiconductor layer 200a', the n-type semiconductor layer 200b' and the nanowire 200c' may be removed. As such, a stress control layer 250 is formed, as depicted in FIG. 9E.

If the stress control material layer is formed, the stress control material layer may be formed on a lower surface of the nanowire 200c'. The thickness of the stress control material layer formed under the nanowire 200c' may be thinner than the stress control material layer formed on other regions. The stress control material layer formed under the nanowire 200c' may be readily removed using a wet etching method.

The stress control layer 250 may be formed of a material having a lattice constant greater than that of Si (e.g., silicon nitride). The nanowire 200c' may be strained in a lengthwise direction due to the stress control layer 250.

Figure 9F:
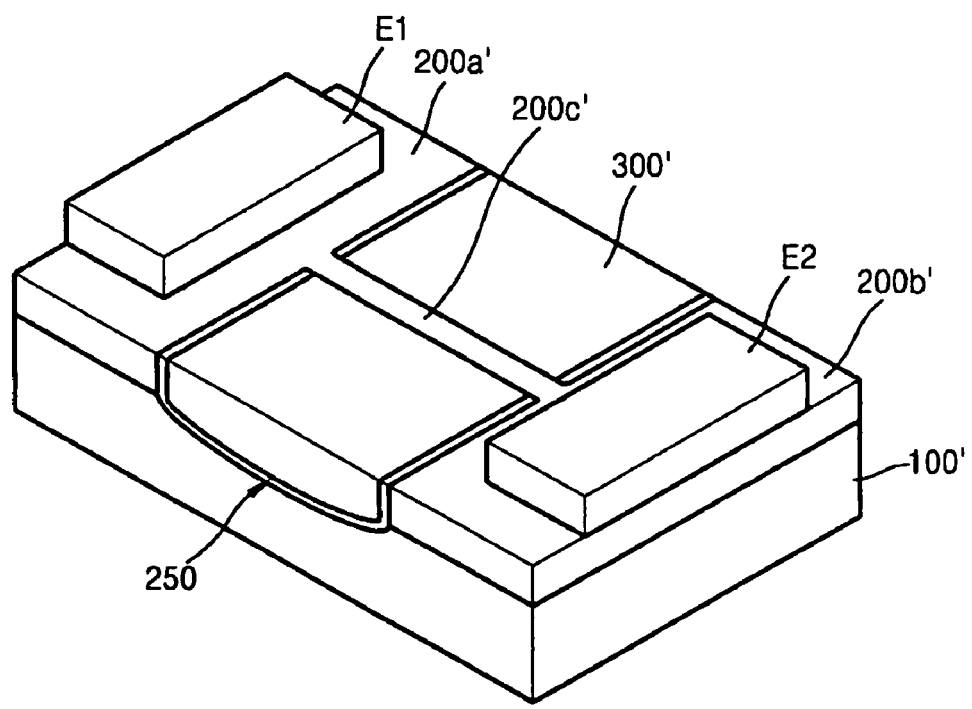

Referring to FIG. 9F, a transparent insulating layer 300' may be formed on the stress control layer 250 between the p-type semiconductor layer 200a' and the s-type semiconductor layer 200b'. The transparent insulating layer 300' may be formed to fill the space under the nanowire 200c'. The transparent insulating layer 300' may be formed of a silicon oxide or resin. The transparent insulating layer 300' may be formed with the thickness the same as the height of the nanowire 200c'.

First and second electrodes E1 and E2 may formed on the p-type semiconductor layer 200a' and the n-type semiconductor layer 200b'. Although not shown, a second transparent insulating layer may be formed approximately to the height of the first and second electrodes E1 and E2 on the transparent insulating layer 300', the stress control layer 250, the nanowire 200c', the p-type semiconductor layer 200a' and the n-type semiconductor layer 200b'.

FIGS. 10A through 10D are diagrams illustrating cross-sectional views of a method of manufacturing a luminous device according to example embodiments.

Figure 10A:
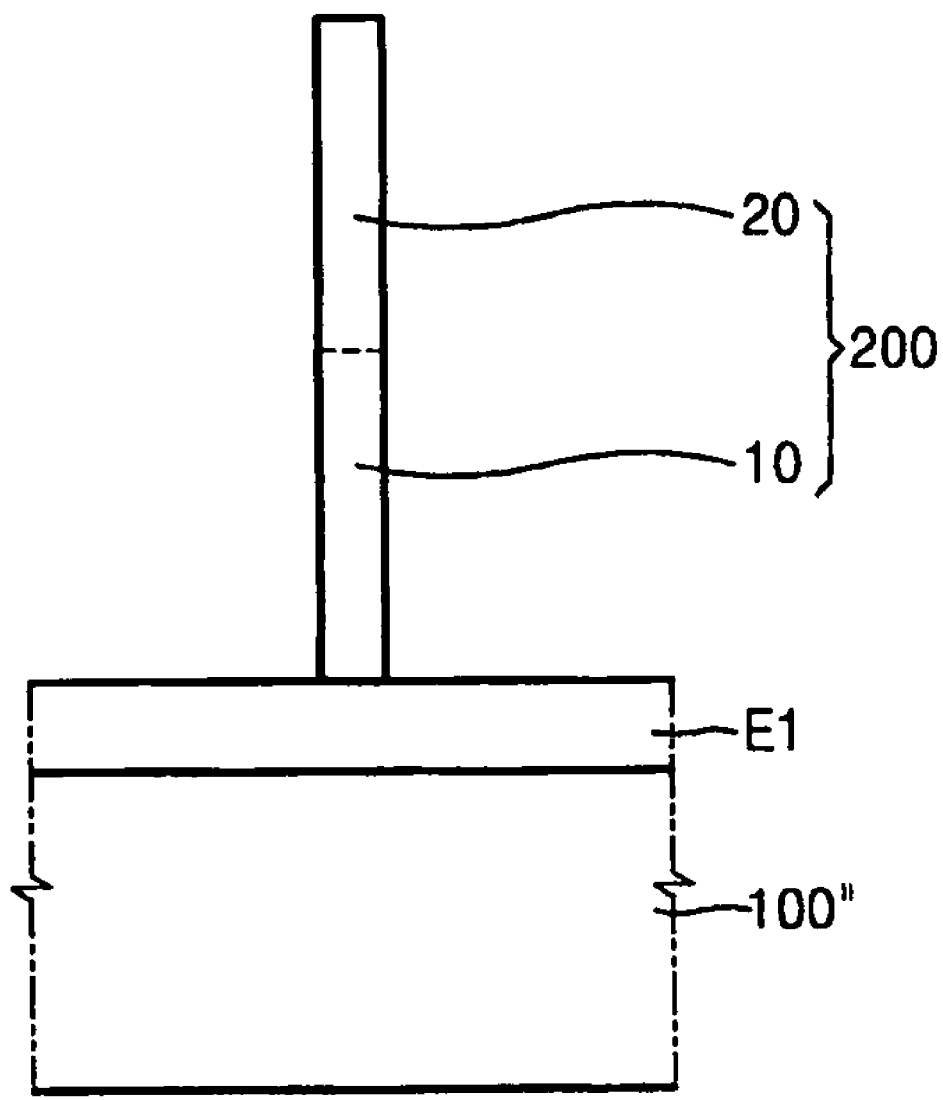

Referring to FIG. 10A, a first electrode E1 may be formed on a substrate 100'. A nanowire 200 may formed on the first electrode E1. The nanowire 200 may be perpendicular to the substrate 100".

The nanowire 200 may be formed in a variety ways. For example, after forming a dot type catalyst layer (not shown) on the first electrode E1, the nanowire 200 of a Si material may be grown by supplying a desired reaction gas and a source gas on the catalyst layer. The catalyst layer may be present between the nanowire 200 and the first electrode E1. A lower part 10 and an upper part 20 of the nanowire 200 may be grown using different methods. For example, if the lower part 10 is formed, a first reaction gas containing an n-type (or a p-type) dopant may be used. If the upper part 20 is formed, a second reaction gas containing a p-type (or an n-type) dopant may be used. The lower part 10 and the upper part 20 may be regions doped with different conductive dopants. Although not shown, a central part of the nanowire 200 may remain an un-doped region.

Referring to FIG. 10B, an oxide layer 50 may be formed by oxidizing the surface of the nanowire 200. The oxide layer 50 may be a silicon oxide layer. If the oxide layer 50 is formed, a compressive stress may be applied to side surfaces of the nanowire 200. The nanowire 200 may be deformed by extending the nanowire 200 in a lengthwise direction. The degree of extension varies according to the thickness of the oxide layer 50. If the thickness of the oxide layer 50 is controlled, the diameter of the nanowire 200 may be controlled.

Figure 10C:
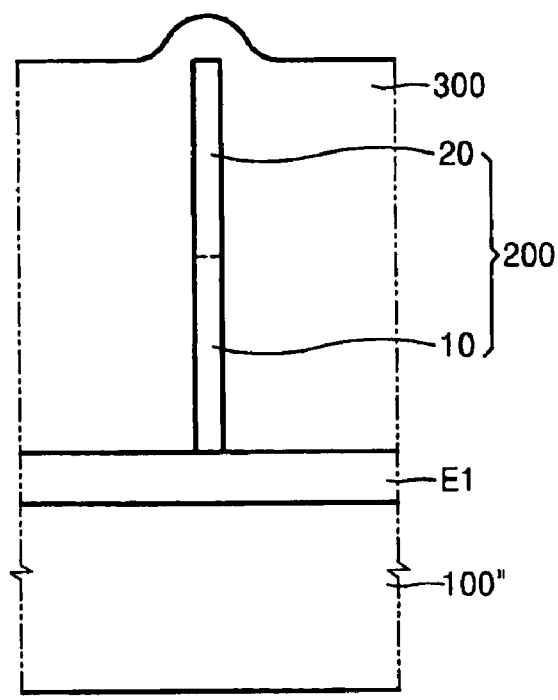

Referring to FIG. 10C, after removing the oxide layer 50, a transparent insulating layer 300 covering the nanowire 200 may be formed on the first electrode E1. Although not shown, if a plurality of nanowires 200 are formed with narrow gaps on the first electrode E1, the transparent insulating layer 300 may not be formed. The transparent insulating layer 300 may be formed without removing the oxide layer 50.

Figure 10D:
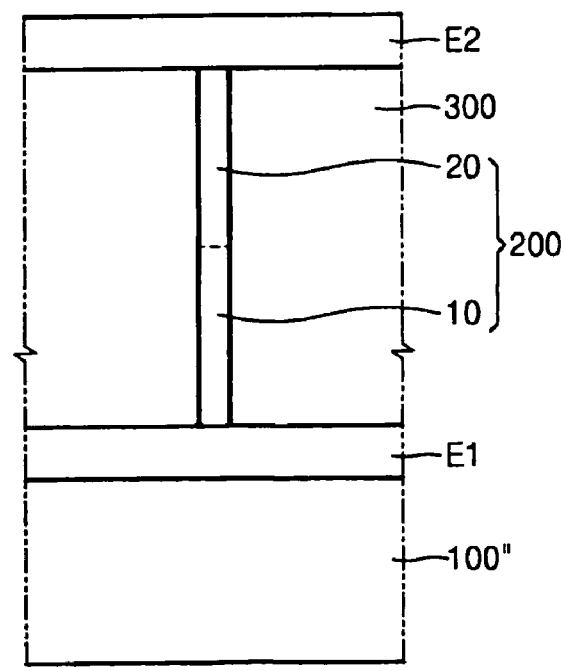

Referring to FIG. 10D, the transparent insulating layer 300 may be etched until the nanowire 200 is exposed using a chemical mechanical polishing (CMP) method or an etchback method. A second electrode E2 that contacts the nanowire 200 may be formed on the transparent insulating layer 300. The first electrode E1 and the second electrode E2 may be formed of conductive silicon, a conductive oxide or a metal.

As described above, because a strained nanowire is used as a light emitting layer, wavelengths of a luminous device may be readily controlled and light emission efficiency may be increased.

Also, because Si may be used to form the strained nanowire, the luminous device may be manufactured at lower costs using a Si based process technique. An ohmic contact between the light emitting layer and an electrode may be readily achieved.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a luminous device, comprising:
   forming a strained semiconductor layer on a substrate;
   patterning the strained semiconductor layer into a first region, a second region and a nanowire fabrication region that connects the first and second regions, wherein the first region and the second region are separated from each other;
   separating the substrate from the nanowire fabrication region;
   forming a strained nanowire by isotropically etching the nanowire fabrication region;
   doping a first conductive type dopant in the first region;
   doping a second conductive type dopant in the second region; and
   forming a first electrode that contacts the first region and a second electrode that contacts the second region,
   wherein the strained nanowire has a lattice constant that increases in a lengthwise direction thereof compared to a non-strained nanowire.

2. The method of claim 1, wherein separating the substrate includes isotropically etching an upper part of the substrate exposed by patterning the strained semiconductor layer.

3. The method of claim 1, wherein an upper part of the substrate has a lattice constant greater than that of the strained semiconductor layer.

4. The method of claim 1, wherein the strained semiconductor layer is a silicon (Si) layer.

5. The method of claim 4, wherein an upper part of the substrate is formed of germanium (Ge) or silicon germanium (SiGe).

6. The method of claim 1, wherein the strained nanowire is divided into a first part adjacent to the first region and a second part adjacent to the second region, wherein the first part is doped with the first conductive type dopant.

7. The method of claim 6, wherein the second part is doped with the second conductive dopant.

8. The method of claim 1, further comprising filling a space between the substrate and the strained nanowire with an insulating layer after forming the strained nanowire.

9. A method of manufacturing a luminous device, comprising:
   forming a semiconductor layer on a substrate;
   patterning the semiconductor layer into a first region, a second region and a nanowire fabrication region that connects the first and second regions, wherein the first and second region are separated from each other;
   separating the substrate from the nanowire fabrication region;
   forming a nanowire by isotropically etching the nanowire fabrication region;
   doping a first conductive type dopant in the first region;
   doping a second conductive type dopant in the second region;
   forming a stress control layer on inner walls of the first and second regions that face each other and the substrate between the first and second regions such that a tensile stress is applied to the nanowire in a lengthwise direction, wherein the portion of the stress control layer which is disposed on the substrate between the first and second regions is disposed below the nanowire and separated from the nanowire; and
   forming a first electrode that contacts the first region and a second electrode that contacts the second region.

10. The method of claim 9, wherein separating the substrate includes isotropically etching an upper part of the substrate exposed by patterning the semiconductor layer.

11. The method of claim 9, wherein the stress control layer has a lattice constant greater than that of the semiconductor layer.

12. The method of claim 9, wherein the semiconductor layer is a silicon (Si) layer.

13. The method of claim 12, wherein the stress control layer is a silicon nitride layer.

14. The method of claim 9, wherein the nanowire is divided into a first part adjacent to the first region and a second part adjacent to the second region, wherein the first part is doped with the first conductive type dopant.

15. The method of claim 14, wherein the second part is doped with the second conductive dopant.

16. The method of claim 9, further comprising forming an insulating layer on the stress control layer after forming the stress control layer.

* * * * *